(12) United States Patent
Dautartas et al.

(10) Patent No.: US 6,258,403 B1
(45) Date of Patent: Jul. 10, 2001

(54) METHOD FOR COATING FACET EDGES OF AN OPTOELECTRICAL DEVICE

(75) Inventors: Mindaugas Fernand Dautartas, Alburtis; Joseph Michael Freund, Fogelsville; Dennis Mark Romero, Bethlehem, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/397,030

(22) Filed: Sep. 16, 1999

(51) Int. Cl.⁷ ....................................................... B05D 5/12
(52) U.S. Cl. .................... 427/163.2; 427/126.3; 427/282; 427/284
(58) Field of Search .................... 118/504, 505; 427/126.3, 282, 284, 163.2; 257/678, 684

(56) References Cited

U.S. PATENT DOCUMENTS

| | | |
|---|---|---|
| 4,695,486 * | 9/1987 | Stark ..................................... 427/282 |
| 5,179,609 | 1/1993 | Blonder et al. . |
| 5,550,088 | 8/1996 | Dautartas et al. . |
| 5,840,122 * | 11/1998 | Williams .............................. 118/505 |
| 5,911,830 * | 6/1999 | Chakrabarti et al. ................ 118/503 |
| 5,935,451 | 8/1999 | Dautartas et al. . |
| 5,989,637 * | 11/1999 | Rizzo et al. .......................... 417/282 |
| 6,026,557 * | 2/2000 | Freund et al. ......................... 29/559 |
| 6,131,263 * | 10/2000 | Freund et al. ....................... 29/426.5 |

* cited by examiner

*Primary Examiner*—Brian K. Talbot
(74) *Attorney, Agent, or Firm*—Dickstein Shapiro Morin & Oshinsky LLP

(57) ABSTRACT

A holding apparatus including a fixture is described. The fixture of the holding apparatus, which receives a semiconductor laser bar for optical coating, includes a base and a pair of walls. The walls and the base have inner surfaces, and the walls have a top surface upon which the laser bar rests. An extending portion of the semiconductor laser bar fits in a cavity formed by the base and the walls. The facet edges of the laser bar do not extend horizontally beyond the walls of the fixture. A coating apparatus applies a coating to the facet edges of the laser bar without contacting any coating material on the extending portion.

11 Claims, 6 Drawing Sheets

METHOD FOR COATING FACET EDGES OF AN OPTOELECTRICAL DEVICE

FIELD OF THE INVENTION

The present invention generally relates to the coating of optoelectrical devices, such as semiconductor laser bars. More particularly, the present invention relates to an apparatus for holding an optoelectrical device during a coating process to inhibit any coating from adhering to portions of the device other than at predetermined facet edges.

BACKGROUND OF THE INVENTION

Semiconductor laser devices, such as double heterostructure laser diodes, are utilized in various applications, such as for optical sources in fiber optic communications. In the manufacture of such devices, double heterostructures are grown and processed on a wafer substrate using, for example, liquid phase epitaxy techniques. The wafer is then cleaved into typically solid rectangular laser bars containing many laser diodes. The laser diodes are functional at the laser bar level, and therefore electrical/optical testing is often performed at this level prior to cleaving the individual laser diodes from the bars.

Each laser bar has two end faces, or facets, formed during the cleaving process. Laser light is ultimately transmitted through the facets, so it is important for their surfaces to remain unperturbed and uncontaminated during handling of the laser bar. Following the cleaving operation on the wafer to form the laser bars, the facets are coated with an optical coating in a facet coating apparatus. A known apparatus for retaining laser bars during the facet coating processes is a facet coat holding fixture. The fixture also transports the bar to and from the facet coating process.

A problem encountered due to the coating process is that often the optical coating deposits on not only the laser bars but also the fixtures used for retaining the laser bars. This may lead to laser bars sticking to the fixtures and to the fixtures becoming contaminated by the optical coating, eventually leading to sticking and gauging of the fixture.

If a laser bar remains adhered to a fixture, an additional operation is then required to detach the laser bar from the fixture. One example of such an additional operation includes manually shaking the fixture to loosen the laser bar. Another example is physically prying the laser bar from the fixture with a pick or other similar device. Such operations result in a reduction in the yield of usable laser bars, since a number of the laser bars become damaged when pried or shaken from the fixture blades. Typically, as many as half of the laser bars may become damaged from these additional operations.

A second problem is that during the coating process, the coating may creep in between the laser bars and the fixtures, becoming deposited on the p-and/or n-bonding sides of the laser bars. This is referred to as overspray. The p-and n-bonding sides of the laser bars include bonding pads formed of gold, or another suitable conductive material. Deposition of the coating on the p- and n-bonding sides may lead to partial covering of the bonding pads, thereby reducing the possible sites for bonding with a solder material. Excessive deposition may reduce the possible sites for bonding to such an extent as to prevent contact bonding or cause a contact bonded laser to fail.

Due to the inherent problems in conventional methodologies related to the coating process, there exists a need for an improved fixture and method for withstanding the effects of overspraying and sticking.

SUMMARY OF THE INVENTION

The present invention provides a semiconductor device holder including a base and a pair of walls extending upwardly from the base. Each of the walls has a top surface for supporting a semiconductor device thereon. The walls are spaced apart to form a cavity with the base, the cavity being sized to receive an extending portion of a semiconductor device mounted on the top surfaces of the walls.

The present invention also provides a system for retaining an optoelectrical device. The system includes an optoelectrical device having first and second surfaces, first and second facet edges, and an element extending from the second surface. The system further includes a holding apparatus with a base and a pair of walls, each of the walls having a top surface upon which the second surface of the optoelectrical device rests with the element extending into a cavity formed by the base and walls.

The present invention also provides a method of coating an optoelectrical device. The method includes the steps of locating an optoelectrical device on a holding device and coating at least one of the facet edges of the optoelectrical device with a coating material. The optoelectrical device has first and second surfaces, first and second facet edges, and an element extending from said second surface. The holding apparatus has a base and a pair of walls, each wall has a top surface which supports the second surface of the optoelectrical device such that the extending element is located between the walls. The extending element is protected from being coated with a coating material by the walls.

These and other features and advantages of the invention will be more clearly understood from the following detailed description of the invention which is provided in connection with the accompanying drawings.

DETAILED DESCRIPTION OF THE PREFERRED EMBODIMENTS

Figure 1:
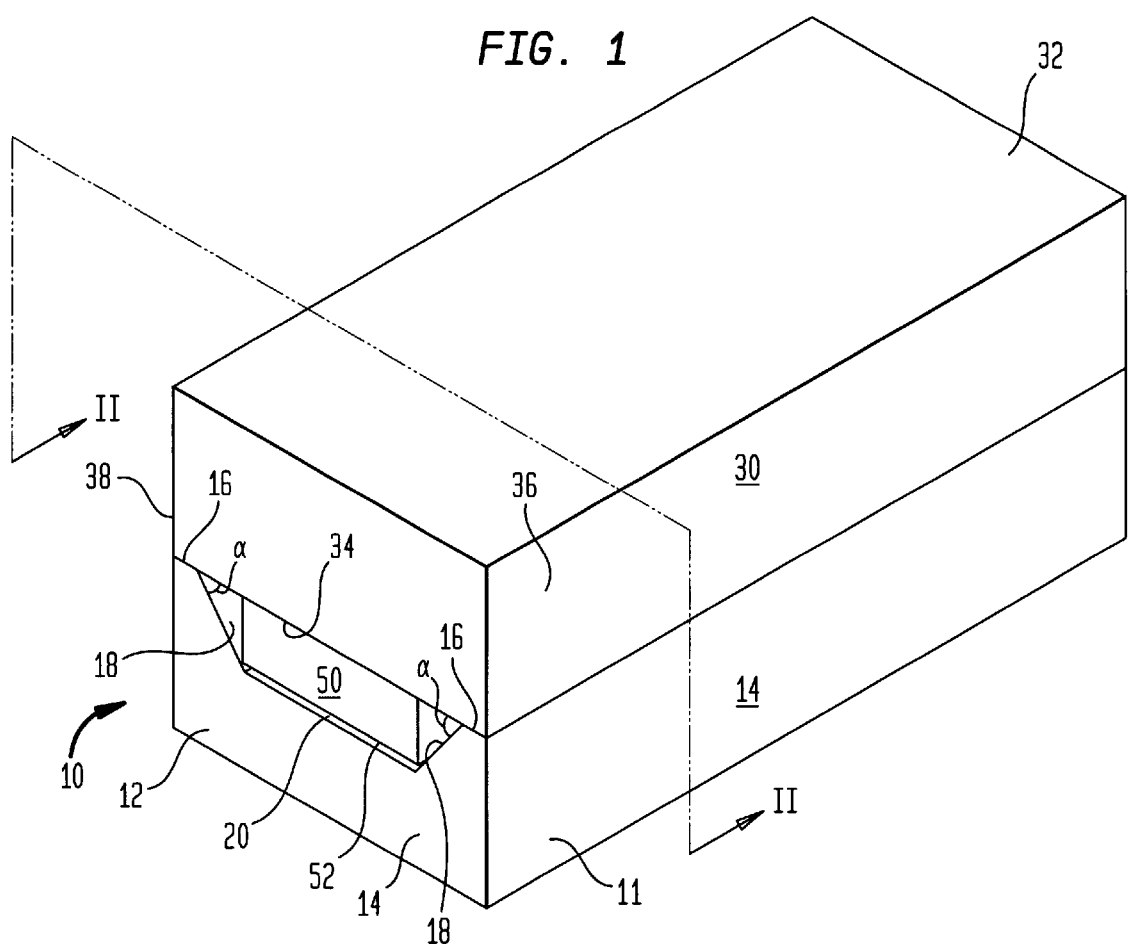
FIG. 1 is a perspective view of an optoelectrical device and a holding apparatus constructed in accordance with an embodiment of the invention.
Figure 2:
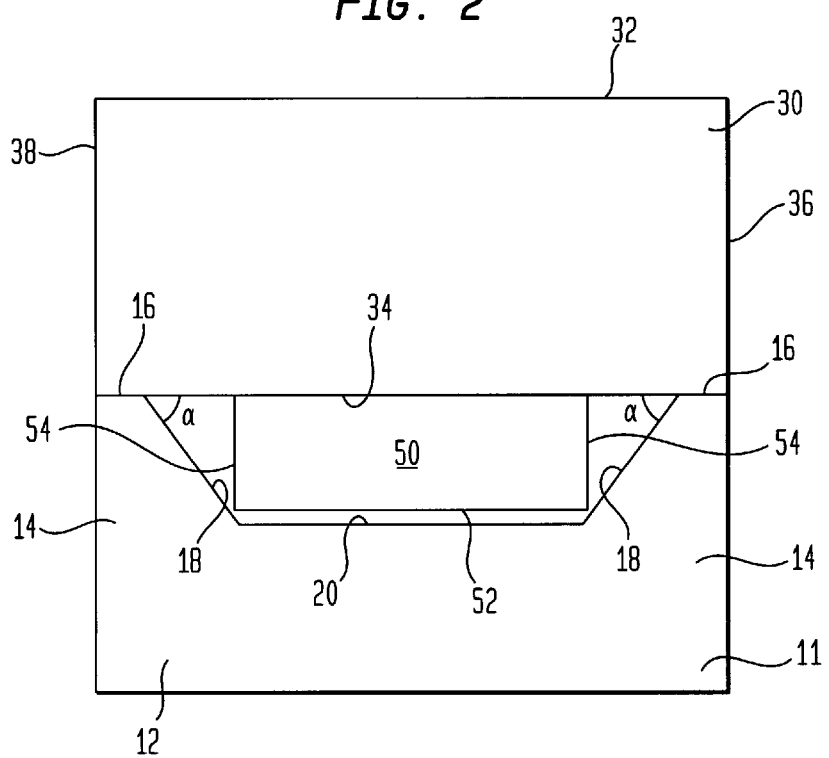
FIG. 2 is a cross-sectional view taken along line II—II of the optoelectrical device and the holding apparatus of FIG. 1.
Figure 3:
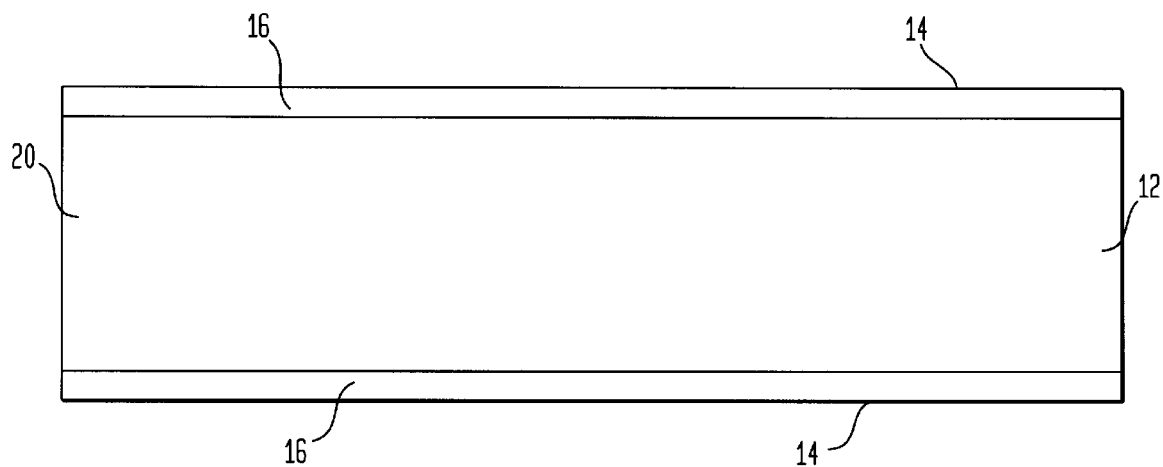
FIG. 3 is a top view of the holding apparatus of FIG. 1.

Referring to FIGS. 1–3, where like numerals designate like elements, there is shown a holding apparatus 10 including a fixture 11. The fixture 11 includes a base 12, a pair of walls 14, and a top surface 16. The base has a base surface 20, and each wall 14 includes a wall surface 18.

The fixture 11 is preferably formed of a material which is resistant to acidic washes, such as, for example, hydrofluoric acid. Hydrofluoric acid is used to clean optical coating from substances upon which is has been deposited. The most preferred material for forming the fixture 11 is silicon, although molybdenum or ceramic materials also may be suitable for the fixture 11. Also, silicon provides a highly smooth surface, which will contact the smooth surface of a semiconductor laser bar (described in detail below), providing intimate contact and reducing the possibility of gaps which could lead to overspray.

The fixture 11 is preferably formed through known photolithographic techniques, such as the techniques described in U.S. Pat. No. 5,935,451 (Dautartas et al.). Alternatively, the fixture 11 may be formed through other known chemical etching procedures or by means of reactive ion etching (RIE).

Resting upon the top surfaces 16 of the walls 14 is a semiconductor laser bar 30. The laser bar 30 includes a first surface, or p-side, 32 and a second surface, or n-side, 34. The bar 30 is formed of a material adapted to create smooth surfaces, such as indium phosphide, gallium arsenide, or other like optoelectrical materials. Further, the semiconductor laser bar 30 includes a first facet edge 36 and a second facet edge 38. With specific reference to FIG. 2, each of the walls 14 is at an angle alpha ($\alpha$) to the second surface 34. The angle $\alpha$ is an acute angle.

An extending element 50 is located on the second surface 34. The element 50 may be any material which is both conductive and compliant, and which is desired to be protected from being coated. Compliancy is important for relieving stress, at any temperature, at a solder bond with the laser bar 30. An example of a suitable element 50 is a compliant metallic material, such as gold. The element 50 fits between the walls 14 and the base 12 when the semiconductor laser bar 30 rests upon the top surfaces 16. The element 50 includes a first surface 52 spaced apart from the base surface 20 when the laser bar 30 is resting on the top surfaces 16. Further, the element 50 includes a pair of sides 54 which are spaced apart from the wall surfaces 18. The tolerance between the element 50 and the fixture 11, i.e., the space between the sides 54 and the surfaces 18 and the first surface 52 and the base surface 20, is controlled to the extent necessary to protect the element 50 from a coating material and to prevent any mechanical interference.

As noted above, the type of material or etch used to form the fixture 11 may affect the angle $\alpha$. For example, if the fixture 11 is formed of a silicon with a crystallographic orientation of [100], the sidewalls etched into the film material will not be normal to the plane of the top surfaces 16. Specifically, an anisotropic etching of [100] silicon produces an angle $\alpha$, of 54.74 degrees. If, on the other hand, a silicon is used having a crystallographic orientation of [110], such a material may be etched so as to produce an angle between each wall 14 and the base 12 of ninety degrees (90°). Further, RIE may produce any angle of about thirty to about ninety degrees between each wall 14 and the base 12.

One aspect of the present invention is that the fixture 11 can be produced using either a positive or a negative photoresist material while the element 50 may be formed on the semiconductor laser bar 30 through the use of the opposite photoresist material. In practice, a positive photoresist material is generally used for forming the fixture 11. Mirroring of the positive photoresist material is accomplished by using the opposite tone for the mask. By mirroring the pattern, the element 50 may accurately fit within the space between the walls 14 and the base 12. This allows the semiconductor laser bars 30 to be selfaligning on the fixtures 11.

Figure 4:
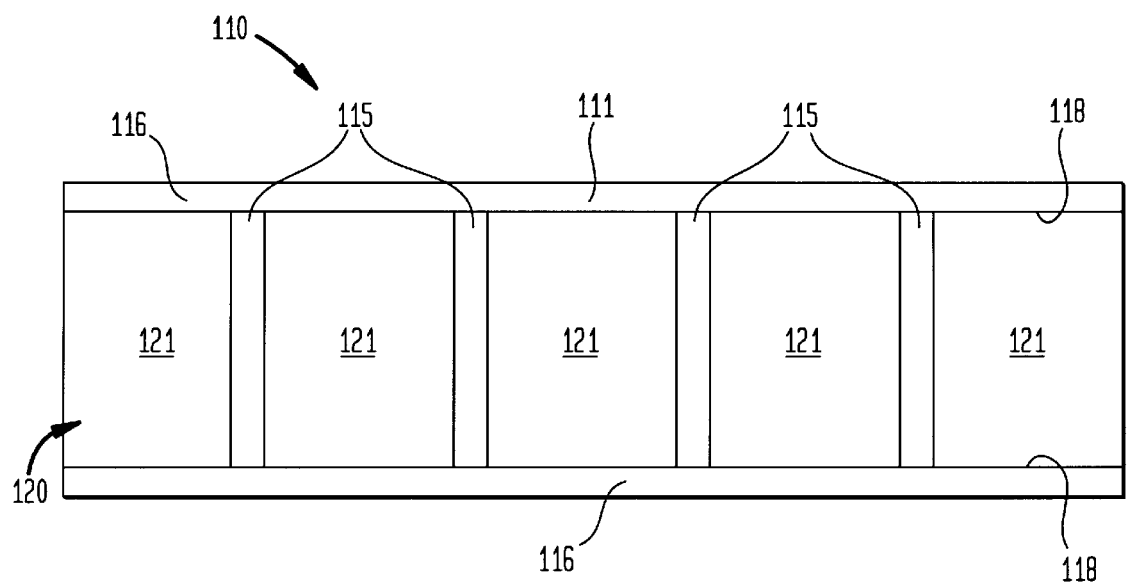
FIG. 4 is a top view of a holding apparatus constructed in accordance with another embodiment of the invention.

FIG. 4 illustrates another embodiment of the present invention. Specifically, there is shown a holding apparatus 110 with a fixture 111. The fixture 111 has a pair of walls 114, with top surfaces 116 and wall surfaces 118, and has a base 120. The base 120 is divided into individual pockets 121 by partitions 115 extending up from the base 120 between each of the walls 114. As illustrated, the partitions 115 are normal to the base 120 and the walls 114.

Figure 5:
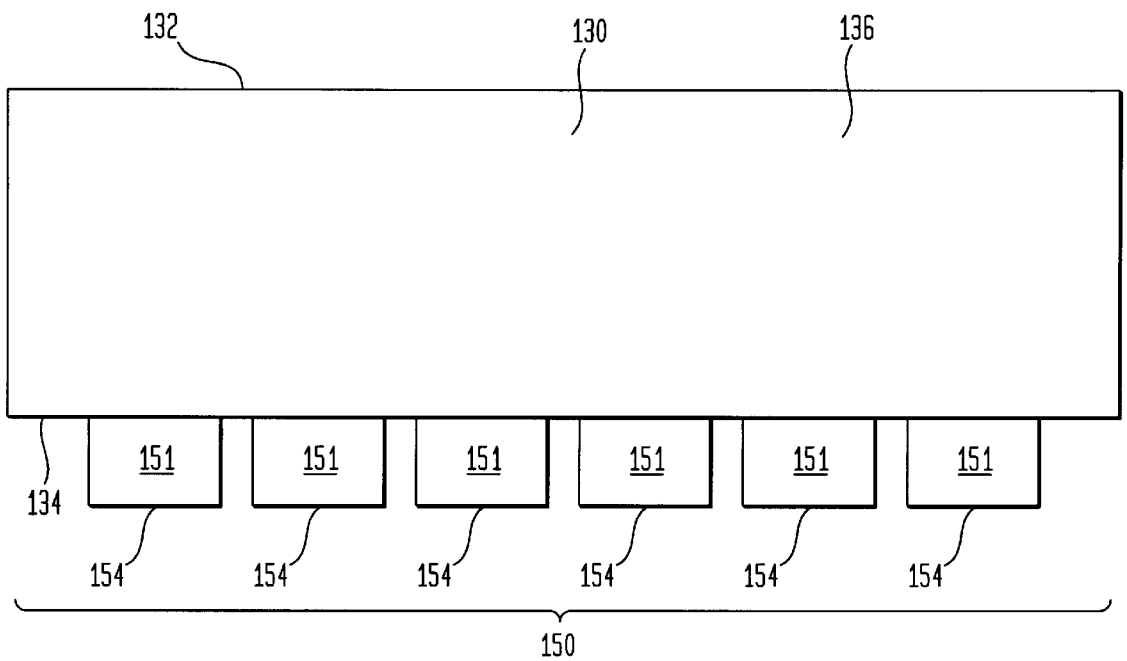
FIG. 5 is a side view of a second optoelectrical device.

FIG. 5 shows a semiconductor laser bar 130 which may be used with the holding apparatus 110 of FIG. 4. The laser bar 130 has a first surface 132 and a second surface 134. The surfaces 132, 134 are separated by a pair of facet edges, including facet edge 136. An extending segment 150 is located on the second surface 134. The segment 150 is broken up into individual portions 151, each portion 151 having a pair of sides 154 (only one being shown in FIG. 5). Each of the portions 151 is sized and shaped to fit within a respective pocket 121 such that the partitions 115 fit between adjacent portions 151.

Figure 6:
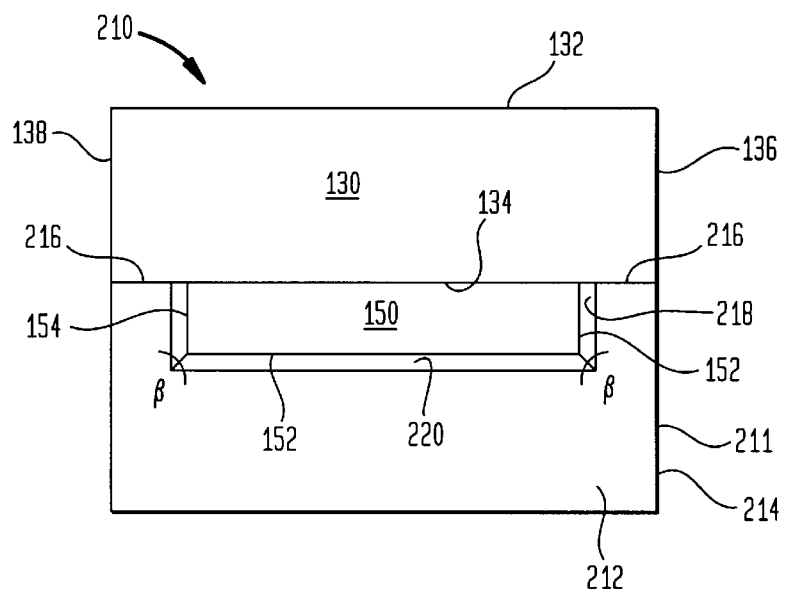
FIG. 6 is a front view of a holding apparatus constructed in accordance with another embodiment of the invention.

The type of material or etch (isotropic, anisotropic, or a mixture thereof) used for the fixture 11 may alter the angle between the walls 14 and the base 12. FIG. 6 shows a holding apparatus having an angle different than the angle $\alpha$. Specifically, there is shown a holding apparatus 210 including a fixture 211. The fixture 211 includes a pair of walls 214, each having a top surface 216, and a base 212 with a base surface 220. The walls 214 have inner surfaces 218 which face one another. The inner surfaces 218 are each at an angle $\beta$ from the base surface 220. As illustrated, angle $\beta$ is 90°.

The semiconductor laser bar 130 rests upon the top surfaces 216 and the segment 150 fits within the space between the inner surfaces 218 and the base surface 220. The segment 150 does not contact the base surface 220.

Figure 7:
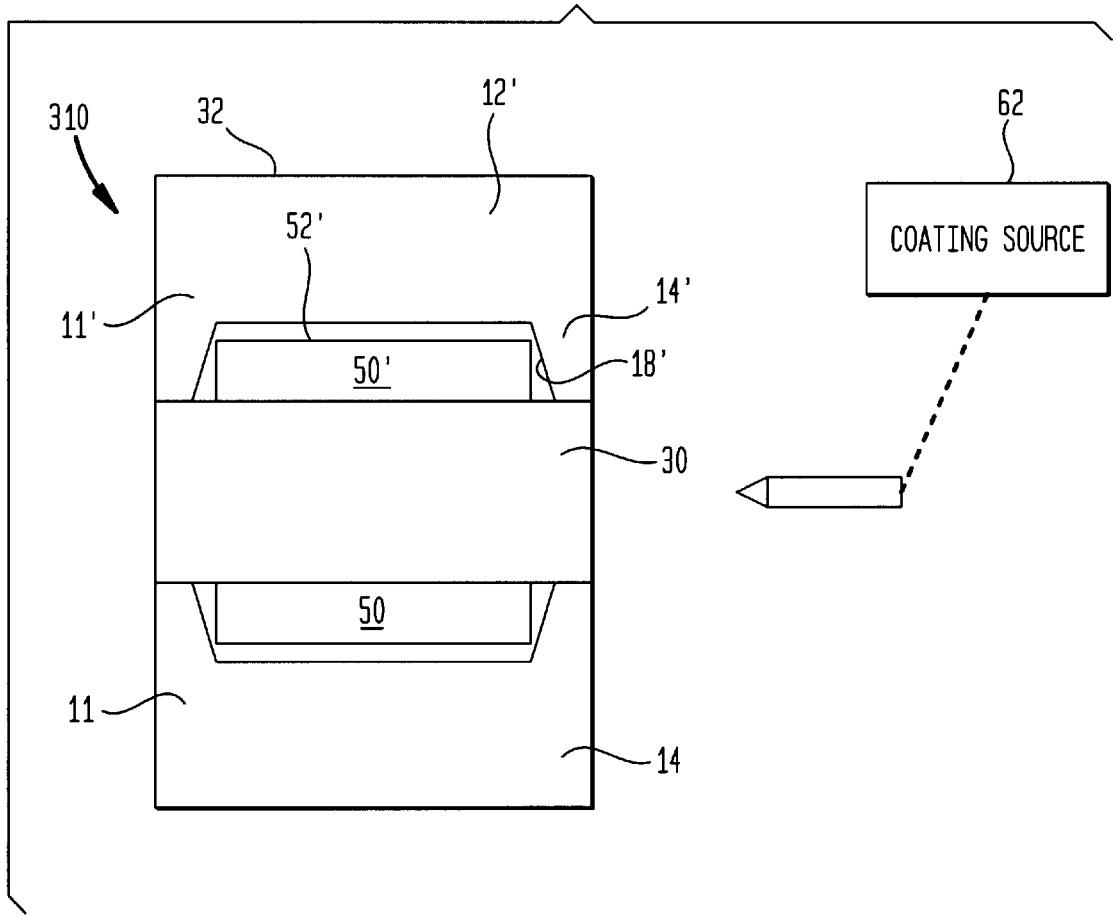
FIG. 7 is a front view of an optoelectrical device and a pair of holding apparatuses constructed in accordance with another embodiment of the invention.

FIG. 7 illustrates yet another embodiment of the present invention. A holding apparatus 310 illustrated therein includes the fixture 11 and a similar fixture 11' having walls 14' and a base 12'. The walls 14' have an inner surface 18', and the base 12' has a surface 20'.

The semiconductor laser bar 30 includes the element 50 and a second element 50' located on the first surface 32. The second surface 34 of the laser bar 30 rests on the fixture 11, while the fixture 11' rests on the first surface 32 of the laser bar 30. Through this arrangement, the coating material 62 from the coating apparatus 60 is inhibited from adhering to the segments 50, 50'.

Figure 8:
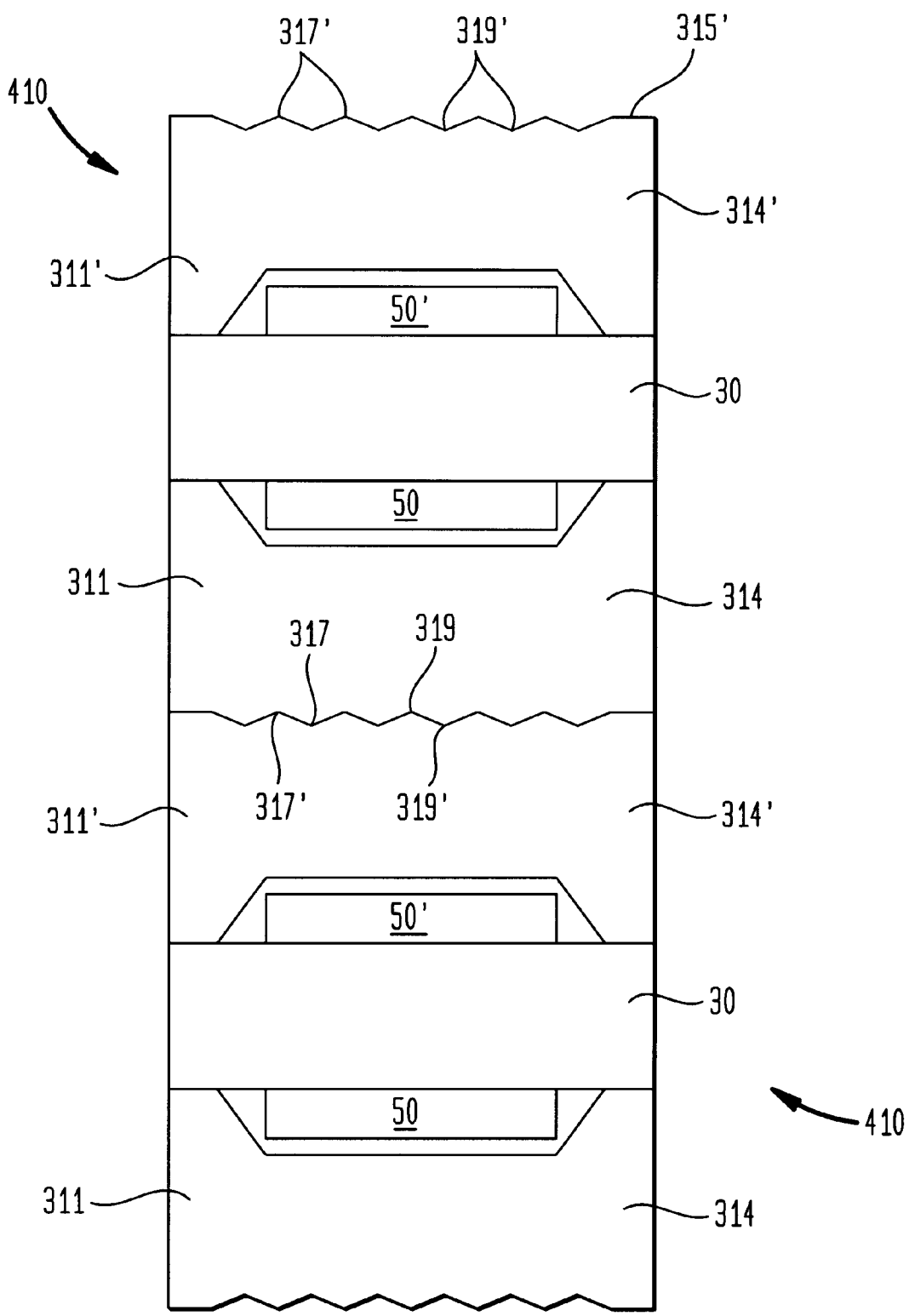
FIG. 8 is a front view of stacked holding apparatuses constructed in accordance with another embodiment of the invention.
Figure 9:
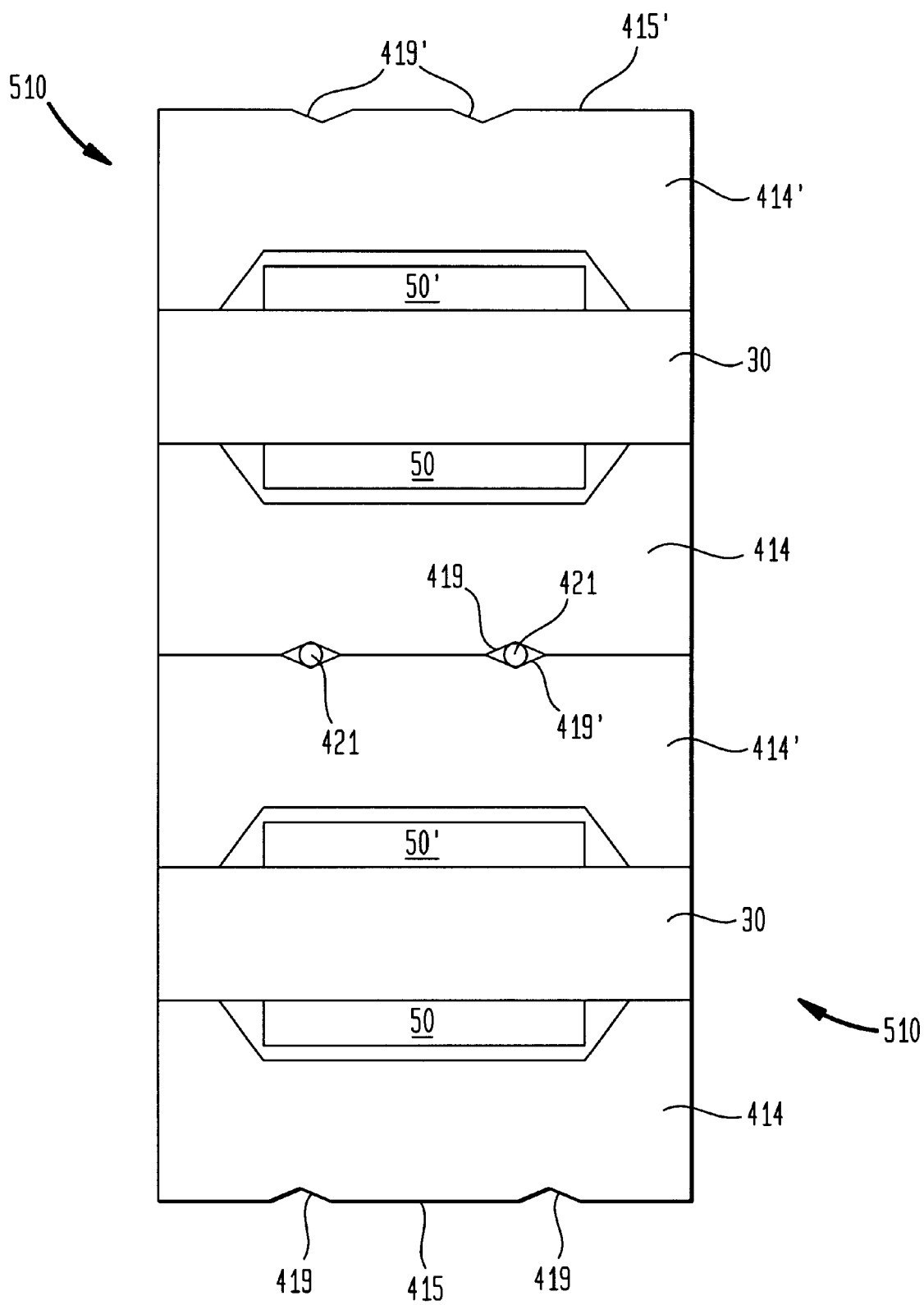
FIG. 9 is a front view of stacked holding apparatuses constructed in accordance with another embodiment of the invention.

FIGS. 8–9 illustrate a plurality of holding apparatuses in a stacked formation. Specifically, FIG. 8 shows a plurality of holding apparatus 410, each including a pair of fixtures 311, 311'. The fixtures 311, 311' have, respectively, walls 314, 314' and stacking surfaces 315, 315'. The stacking surfaces 315, 315' include ridges 317, 317' and grooves 319, 319'. As illustrated, the ridges 317 fit within the grooves 319', and the ridges 317' fit within the grooves 319. In this way, the holding apparatuses 410 are self-aligning and can be easily stacked and clamped together to allow for coating a plurality of laser bars 30.

FIG. 9 shows a plurality of holding apparatuses 510 stacked one on the other. Extending between the walls 414, 414' are, respectively, stacking surfaces 415, 415'. The stacking surfaces 415 include grooves 419 and the stacking surfaces 415' include grooves 419'. An alignment structure 421 is placed within a space created by matching grooves 419 and 419'. As with the holding apparatuses 410 shown in FIG. 8, the holding apparatuses 510 are selfaligning and easily stacked and clamped without the need for intricate aligning fixtures.

Next will be described a method of coating a semiconductor laser bar 30, 130 through the use of one of the fixtures 11, 111, 211, or the fixtures 11, 11' together. With specific reference to FIG. 2, the semiconductor laser bar 30 is positioned on the top surfaces 16 with the element 50 protected within the space between the walls 14 and the base 20. The fixture 11 is sized and shaped such that the facet edges 36, 38 do not extend beyond the walls 14. A coating apparatus 60 in connection with a source 62 of coating material is positioned within line of sight of one of the facet edges 36, 38 to be coated. During the coating of the facet edge 36, the element 50 is protected from the coating material 62. A similar method may be used with the fixtures 111, 211. The coating apparatus 60 is preferably a line-of-sight apparatus, which limits the amount of coating from areas other than the facet edges 36, 38.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the fixture 11 is shown in FIG. 7 used with the fixture 11', it is to be understood that the other fixtures 111, 211 may be used in tandem with respective second fixtures 111, 211. Further, depending upon the configuration of the element 50, a fixture, such as the fixture 11, may be used in tandem with another embodiment of fixture, such as fixtures 111 or 211. Additionally, although only two holding apparatuses 410, 510 are shown in stacked relationships, it is to be understood that more than two apparatuses 410, 510 may be stacked. Also, while the alignment structures 421 are shown to be spherical, it is to be understood that any suitably configured structure may be used. In addition, the figures are intended to be illustrative only, and relative dimensions of some of the elements may have been enlarged to better illustrate the invention. Accordingly, the invention is not to be seen as limited by the foregoing description, but is only limited by the scope of the appended claims.

What is claimed as new and desired to be protected by letters patent of the united states is:

1. A method of coating an optoelectrical device, said method comprising the steps of:

locating an optoelectrical device on a first holding device, said optoelectrical device having first and second surfaces, first and second facet edges, and an element extending from said second surface, said first holding device having a base and a pair of walls, each said wall having a top surface which supports said second surface of said optoclectrical device such that said extending element is located between said walls; and coating at least one of said facet edges with a coating material, said extending element being protected from being coated with said coating material by said walls.

2. The method of claim 1, further comprising the step of aligning said optoelectrical device on said first holding device.

3. The method of claim 2, wherein said extending element has a pair of edges, each said edge being spaced apart from an inner surface of a respective said wall.

4. The method of claim 3, wherein said base and walls of said holding apparatus comprise silicon.

5. The method of claim 4, wherein said base and walls of said first holding device comprise molybdenum.

6. The method of claim 3, wherein said base and walls of said first holding device comprise a ceramic material.

7. The method of claim 3, wherein said extending element comprises a plurality of portions and said first holding device comprises a plurality of partitions with a pocket located between any two partitions, each said portion fitting within a respective said pocket.

8. The method of claim 1, further comprising locating a second holding device having a second base and a pair of second walls, each said second wall having a surface resting upon said first surface of said optoelectrical device, wherein said optoelectrical device has a second extending portion which is protected from being coated with said coating material by said second walls, said first and second holding devices forming a first holding apparatus.

9. The method of claim 8, further comprising stacking a second holding apparatus on said first holding apparatus, said first and second holding devices further comprising at least one stacking surface.

10. The method of claim 9, wherein said stacking surfaces comprise a plurality of alternating ridges and grooves.

11. The method of claim 9, further comprising a plurality of alignment structures, wherein said stacking surfaces comprise a plurality of grooves, each said alignment structure being placed within one of said grooves.

* * * * *